United States Patent
Suzuki

(10) Patent No.: US 6,433,347 B1
(45) Date of Patent: Aug. 13, 2002

(54) CHARGED-PARTICLE-BEAM PROJECTION-EXPOSURE METHODS AND APPARATUS THAT SELECTIVELY EXPOSE DESIRED EXPOSURE UNITS OF A RETICLE PATTERN

(75) Inventor: Kazuaki Suzuki, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/336,866

(22) Filed: Jun. 18, 1999

(30) Foreign Application Priority Data

Jun. 19, 1998 (JP) .......................................... 10-188116

(51) Int. Cl.[7] .............................................. G03F 9/00
(52) U.S. Cl. .............................. 250/492.22; 250/492.2; 250/492.23; 250/398; 250/396 ML; 250/396 R
(58) Field of Search .......................... 50/492.22, 492.2, 50/492.23, 396 ML, 396 R, 398

(56) References Cited

U.S. PATENT DOCUMENTS 5,288,567 A * 2/1994 Sakamoto et al. .............. 430/5
5,973,333 A * 10/1999 Nakasuji et al. ........ 250/492.23
6,008,498 A * 12/1999 Simizu ................... 250/492.22

* cited by examiner

*Primary Examiner*—Bruce Anderson
*Assistant Examiner*—Nikita Wells
(74) *Attorney, Agent, or Firm*—Klarquist Sparkman LLP

(57) ABSTRACT

Methods and apparatus are disclosed for performing charged-particle-beam projection exposure of selected exposure units of a pattern, defined by a reticle, without compromising throughput or transfer accuracy. An illumination beam sequentially illuminates individual exposure units (e.g., subfields) of the reticle pattern to form a patterned beam. The patterned beam sequentially projects images of the illuminated exposure units on a sensitive substrate (e.g., resist-coated wafer). The images are formed on the substrate so as to be stitched together in a manner that reproduces the entire pattern over a large field on the substrate. Exposure is controllably performed according to data concerning whether the illumination beam should be ON or OFF, according to data concerning exposure-dose values, and/or according to data concerning focal position for each respective exposure unit.

19 Claims, 8 Drawing Sheets

| (m,n) | (x,y) | ~ | Beam ON/OFF | Exposure Dose | Focal Position |
|---|---|---|---|---|---|
| (1,1) | | | | | |
| (2,1) | | | | | |
| ⋮ | | | | | |
| (20,120) | | | | | |

| (m,n) | Beam ON/OFF |
|---|---|
| (1,1) | 0 |
| (2,1) | 0 |
| (3,1) | 1 |
| (4,1) | 1 |
| (1,2) | 0 |
| ⋮ | ⋮ |
| (2,10) | 0 |
| (3,10) | 1 |
| (4,10) | 1 |

A

| (m,n) | Beam ON/OFF |
|---|---|
| (1,1) | 1 |
| (2,1) | 1 |
| (3,1) | 1 |
| ⋮ | ⋮ |
| (2,10) | 1 |
| (3,10) | 1 |
| (4,10) | 1 |

B

| (m,n) | Beam ON/OFF |
|---|---|
| (1,1) | 1 |
| (2,1) | 1 |
| (3,1) | 1 |
| (4,1) | 1 |
| ⋮ | ⋮ |
| (1,10) | 0 |
| (2,10) | 0 |
| (3,10) | 0 |
| (4,10) | 0 |

| (m,n) | Exposure Dose | Focal Position |
|---|---|---|
| (1,1) | 9.5μC/cm² | 0.3μm |
| (2,1) | 9.5μC/cm² | 0.3μm |
| (3,1) | 10μC/cm² | 0μm |
| (4,1) | 10μC/cm² | 0μm |
| ⋮ | ⋮ | ⋮ |
| (1,5) | 10μC/cm² | 0μm |
| (2,5) | 10μC/cm² | 0μm |
| ⋮ | ⋮ | ⋮ |
| (4,10) | 10μC/cm² | 0μm |

LITHOGRAPHY STEP

CHARGED-PARTICLE-BEAM PROJECTION-EXPOSURE METHODS AND APPARATUS THAT SELECTIVELY EXPOSE DESIRED EXPOSURE UNITS OF A RETICLE PATTERN

FIELD OF THE INVENTION

This invention pertains to microlithography methods and apparatus employing a charged particle beam (e.g., electron beam) to perform projection-exposure of, e.g., a circuit pattern defined by a reticle or the like onto a suitable substrate (e.g., semiconductor wafer). More specifically, the invention pertains to such methods and apparatus permitting projection-exposure of desired exposure units on the reticle while achieving improved throughput and transfer accuracy.

BACKGROUND OF THE INVENTION

Projection microlithography is used extensively in the manufacture of semiconductor integrated circuits, displays, and the like. Virtually all contemporary microlithography methods utilize a beam of light (typically ultraviolet light) to perform pattern transfer (microlithography using a light beam is termed "optical" microlithography). However, due to the current inability of light to achieve resolution of feature sizes required for the next generation of integrated circuits, various microlithography methods using a beam other than light are now being considered. Among such new methods, microlithography using a charged particle beam (e.g., an electron beam) is currently the subject of intensive investigation (microlithography using a charged particle beam is termed "CPB" microlithography).

In either optical or CPB microlithography, the pattern to be transferred to the substrate is defined by a reticle. All or a portion of the reticle is illuminated by an "illumination beam" passing through an "illumination-optical system" located upstream of the reticle. Portions of the illumination beam passing through the illuminated region of the reticle the "patterned beam" or "imaging beam") are projected using a projection-optical system (located downstream of the reticle) onto a semiconductor wafer or other suitable substrate. The substrate is coated with a resist that, when exposed to the patterned beam, is imprintable with the pattern.

The reticle can define the pattern for a single chip (i.e., for a single "die") or for multiple dies. Alternatively, the reticle can define a single inspection pattern or multiple inspection patterns. The entire reticle need not be exposed in a single exposure or "shot." For example, the reticle can comprise multiple regions ("exposure units") that are individually exposed. To achieve such selected exposure, certain conventional optical microlithography systems have a movable mechanical field aperture ("reticle blind") that trims the illumination beam to illuminate only a desired portion of the reticle while not illuminating other portions of the reticle. Certain other conventional optical microlithography apparatus perform exposure by scanning selected exposure fields of the reticle using a slit-shaped portion of the illumination beam. In either method of exposure, the illumination beam is maintained at a constant intensity and focal position for the selected exposure field. I.e., within the selected exposure field, the beam intensity and focal position are not variable.

In conventional optical microlithography apparatus employing a reticle blind, it is desirable to have the reticle blind located immediately adjacent (just upstream of) the reticle to minimize defocusing of the image of the reticle blind on the reticle. Also, with such apparatus that perform scanning exposure of the reticle, it is necessary to scan the field aperture as the reticle stage is being scanned, as disclosed in Japanese Kôkai Patent Publication No. Hei 6-232031.

With a field aperture, the magnitude of defocusing of the image of the field aperture at the image plane is proportional to the axial distance between the field aperture and the reticle pattern. To solve this problem, the illumination-optical system in some conventional optical microlithography systems defines a plane conjugate with the reticle, and the field aperture is situated at that plane. However, such a configuration results in excessive complexity of the illumination-optical system. Furthermore, even with such a configuration, as the reticle is scanned during exposure, it is necessary also to scan the field aperture, as disclosed in Japan Kôkai Patent Publication No. Hei 7-94387.

Whereas field apertures have been employed as described above with conventional optical microlithography systems, no such employment of field apertures has been proposed for CPB microlithography apparatus and methods. For example, placing a reticle blind immediately upstream of the reticle is not practical with conventional CPB microlithography apparatus in which multiple coils, deflectors, and the like are typically situated just upstream of the reticle to minimize disturbance fields at the reticle. Also, in situations in which the field aperture should be scanned along with scanning the reticle stage, having to include the necessary scanning mechanism for the field aperture precludes placement of the field aperture adjacent to and immediately upstream of the reticle.

Many semiconductor "system" integrated circuits (termed "system LSI" circuits) have been produced recently. System LSI circuits combine logic circuits and memory circuits in a single chip. During manufacture, the layer-to-layer step differences within each system LSI chip tend to be relatively high, making them susceptible to differences in the best-focus position during microlithography steps. Also, during manufacture of such chips, the optimal exposure dose varies depending upon positional factors such as differences in resist thickness due to variations in step height and/or differences in beam reflectivity of material underlying the resist. Consequently, it has not been possible with conventional CPB microlithography apparatus employing single-shot and/or slit-illumination scanning exposure to control the exposure dose and focal position adequately in each exposure unit.

Furthermore, in the face of such problems, conventional CPB microlithography methods and apparatus cannot achieve sufficiently high throughput to be of practical utility in a contemporary wafer-fabrication facility, especially for mass-producing semiconductor devices such as DRAMs and the like. Low throughput with conventional CPB systems is also the result of limitations on the size of the optical field that will provide good correction of aberrations.

SUMMARY OF THE INVENTION

The present invention addresses the types of problems summarized above with the prior art. An object of the invention is to provide methods and apparatus that projection-expose a pattern, defined on a reticle or analogous device, onto a sensitive substrate using a charged particle beam (e.g., electron beam). Another object is to provide such methods and apparatus that achieve such ends with an acceptable level of throughput and pattern-transfer accuracy.

According to a first aspect of the invention, methods are provided for performing projection microlithography using a charged particle beam. According to a first representative embodiment of such a method, a pattern is defined on a reticle for transfer of the pattern to a sensitive substrate (e.g., semiconductor wafer). The pattern is divided on the reticle into separate exposure units each defining a respective portion of the pattern. The individual exposure units are sequentially illuminated using a charged-particle illumination beam. As particles in the illumination beam pass through each exposure unit, a charged-particle patterned beam is formed propagating downstream of the reticle. For each illuminated exposure unit, the respective patterned beam is projected onto a respective region of the sensitive substrate. Thus, an image of the illuminated exposure unit is formed on the respective region of the substrate. The respective regions are located so as to cause the images of the illuminated exposure units to be stitched together. Also according to the method, ON/OFF control data are provided for the illumination beam for each of the exposure units on the reticle. Each exposure unit is exposed based on the ON/OFF data.

In the foregoing method, the pattern can be defined on the reticle such that the exposure units are arranged in a two-dimensional array in X and Y directions on the reticle. The exposure units are sequentially illuminated in the X direction by a controlled deflection of the illumination beam. In coordination with illumination of the exposure units, the respective patterned beam is controllably deflected in the X direction. The X-direction deflections are coordinated with movements of the reticle and substrate in the Y direction as required to sequentially project each exposure unit onto a desired location on the sensitive substrate.

Whenever an exposure unit is encountered in which the illumination beam should be OFF, exposure is advanced to a subsequent exposure unit without illuminating the previous exposure unit.

The controlled deflections of the patterned beam in the X direction can be coordinated with continuous movements of the reticle and substrate in the Y direction as required to sequentially project each exposure unit onto a desired location on the sensitive substrate.

At a Y coordinate including one or more exposure units in which the illumination beam should be OFF, the reticle and substrate can be moved at respective velocities that are increased relative to respective base velocities at a Y coordinate having no exposure units in which the illumination beam should be OFF. The increased velocities are greater than base velocities according to a number of exposure units arrayed in the X direction at the respective Y coordinate in which the illumination beam should be OFF.

According to second representative embodiment of methods according to the invention, a pattern to be transferred to a sensitive substrate is defined on a reticle. The pattern is divided on the reticle into multiple exposure units. Individual exposure units are sequentially illuminated with an illumination charged particle beam to form, for each illuminated exposure unit, a respective patterned beam propagating downstream of the reticle. The respective patterned beams are sequentially projected to form respective images of the exposure units on the sensitive substrate. The respective images are situated on the substrate such that the images are stitched together on the sensitive substrate to form the pattern on the substrate. For each exposure unit, data are provided for at least one of exposure-dose value ($\mu C/cm^2$) and focal position, wherein the steps of illuminating the exposure units on the reticle and projecting the respective patterned beam are performed according to the data. By way of example, the exposure-dose value and focal-position data can pertain to a characteristic of the sensitive substrate.

According to another aspect of the invention, charged-particle-beam projection-exposure apparatus are provided. A first representative embodiment of such an apparatus comprises a movable substrate stage and a movable reticle stage on which a sensitive substrate and reticle, respectively, are mountable. The reticle defines a pattern to be projection-transferred to the substrate, wherein the pattern is divided on the reticle into multiple exposure units two-dimensionally arrayed in X and Y directions. The apparatus also includes an illumination-optical system that sequentially illuminates individual exposure units on the reticle with a charged-particle illumination beam. (Particles of the illumination beam passing through an illuminated exposure unit form a patterned beam propagating downstream of the reticle.) The apparatus also includes a projection-optical system that projects the patterned beam to form an image of the illuminated exposure unit at a desired location on the sensitive substrate. The images of the respective exposure units are situated on the substrate so as to be stitched together and form the pattern on the substrate. The apparatus also includes a controller connected to so as to controllably operate the reticle stage, the substrate stage, the illumination-optical system, and the projection-optical system. The controller is operable to perform one or more of the following: (1) cause the illumination-optical system and the projection-optical system to deflect the illumination beam and patterned beam, respectively, in the X direction so as to sequentially illuminate and project exposure units on the reticle; (2) cause the reticle stage and substrate stage to move coordinatedly in the Y direction to sequentially illuminate and project exposure units on the reticle; and (3) provide exposure data concerning ON/OFF control of illumination for each exposure unit.

The controller can be further operable to cause the illumination beam and the patterned beam to have a small-stroke deflection in the Y direction. In such an instance, the controller causes sequential exposure of the exposure units while continuously moving the reticle stage and substrate stage at least at a base velocity during exposure. The controller also increases the base velocity by a factor proportional to a number of exposure units, arrayed in the X direction at a respective Y coordinate value, that have OFF exposure data.

According to a second representative embodiment, a charged-particle-beam projection-exposure apparatus according to the invention can comprise, in addition to the reticle stage, substrate stage, illumination-optical system, and projection-optical system summarized above, a controller connected to so as to controllably operate the reticle stage, the substrate stage, the illumination-optical system, and the projection-optical system. The controller in such an embodiment: (1) causes the illumination-optical system and the projection-optical system to deflect the illumination beam and patterned beam, respectively, in the X direction so as to sequentially illuminate and project exposure units on the reticle; (2) causes the reticle stage and substrate stage to move coordinatedly in the Y direction to sequentially illuminate and project exposure units on the reticle; and (3) provides exposure data concerning at least one of exposure dose and focal position for each respective exposure unit.

By providing exposure data concerning ON/OFF control information for the charged particle beam for each exposure unit, it is possible to select which exposure units to expose and which not to expose with a resolution of exposure-unit size. Such selective exposure of exposure units can be performed using a blanking aperture provided in the illumination-optical system. Namely, whenever the illumination beam is to be ON for a particular exposure unit, the illumination beam is passed through the center of the blanking aperture. Whenever the illumination beam is to be OFF, the beam can be deflected and thus blocked by the blanking aperture.

By providing exposure data such as exposure-dose values and/or focal position for each exposure unit, exposure is possible (at a desired exposure-unit resolution) with accompanying changes in optimal exposure dose and/or best focus position within a chip.

The foregoing and additional features and advantages of the invention will be more readily apparent from the following detailed description which proceeds with reference to the accompanying drawings.

BRIEF DESCRIPTION OF THE DRAWINGS

FIG. 6 is a table of exposure data for exposing the desired subfields shown in FIG. 5.

DETAILED DESCRIPTION

Figure 3:
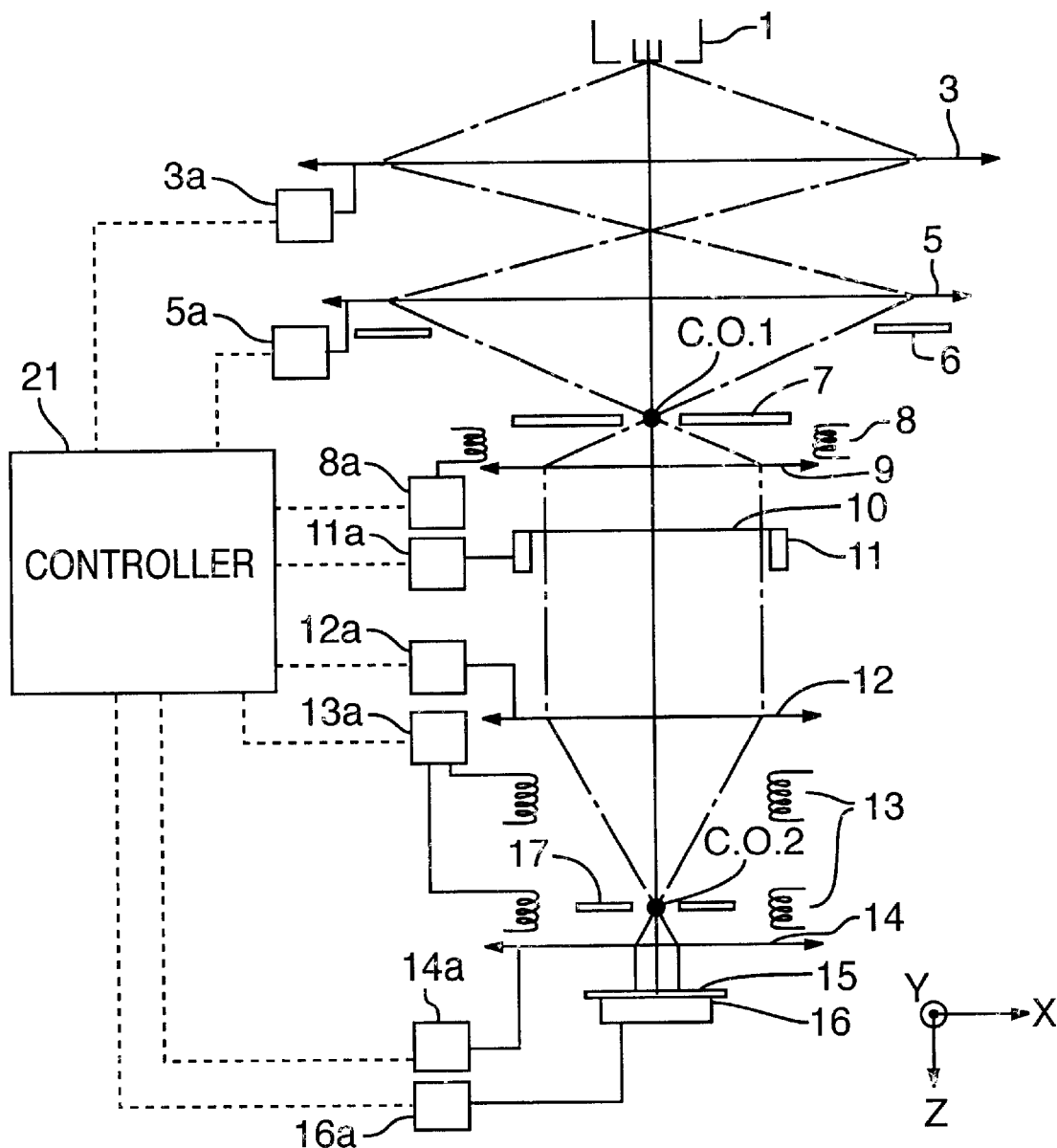
FIG. 3 is an elevational schematic depiction showing certain imaging relationships and control systems in a representative embodiment of a charged-particle-beam (namely, electron beam) projection-exposure apparatus according to a representative embodiment of the invention.

An overall configuration of a CPB microlithography (projection-exposure) apparatus according to a representative embodiment is shown in FIG. 3. FIG. 3 also depicts certain imaging relationships and control systems. The discussion with respect to FIG. 3 is in the context of an electron beam, but it will be understood that any of various other charged particle beams (e.g., ion beam) can be employed with the FIG. 3 apparatus.

An electron gun 1 is situated at the extreme upstream end of the optical system. The electron gun 1 emits an electron beam (specifically the "illumination beam" as discussed further below) in the downstream direction along an optical axis AX. A two-stage condenser lens 3, 5 is situated downstream of the electron gun 1. The electron beam passes through the condenser lenses 3, 5 and forms a crossover image (of the gun) at a blanking aperture 7.

A beam-shaping aperture 6 (having a rectangular or other suitably shaped opening) is situated downstream of the condenser lens 5. The beam-shaping aperture 6 shapes the illumination beam by transmitting only a portion of the illumination beam sufficient to illuminate one "exposure unit" on the reticle 10. (An "exposure unit" is the area on the reticle illuminated by the illumination beam at a given instant of time; an exemplary exposure unit is a reticle "subfield.") For example, the beam-shaping aperture 6 is sized to provide the illumination beam with a square transverse profile having dimensions slightly more than $(1 \text{ mm})^2$ as illuminated onto the reticle 10. An image of the beam-shaping aperture 6 is formed on the reticle 10 by a lens 9.

The portion of the optical system between the electron gun 1 and the reticle 10 is termed the "illumination-optical system," and the beam that passes through the illumination-optical system is the "illumination beam."

The blanking aperture 7 is situated, downstream of the beam-shaping aperture 6, at the position at which a crossover C.O.1 is formed. An illumination-beam deflector 8 is situated downstream of the blanking deflector 7. The illumination-beam deflector 8 primarily sequentially scans the illumination beam in the X direction in FIG. 3, illuminating each exposure unit on the reticle 10 that is within the field of the illumination-optical system. The condenser lens 9 is situated downstream of the illumination-beam deflector 8. The lens 9 collimates the electron beam for impingement on the reticle 10.

In FIG. 3, only the reticle exposure unit situated on the optical axis AX is shown. However, it will be understood that the reticle 10 actually extends much farther within the plane perpendicular to the optical axis AX (i.e., the reticle 10 extends in the X-Y plane). The reticle 10 typically defines the pattern for an entire layer of a semiconductor-device chip (i.e., for a chip pattern). The electron beam is deflected by the deflector 8 as described above to selectively illuminate each exposure unit in the field of the illumination-optical system.

The reticle 10 is mounted on a reticle stage 11 that is movable in the X and Y directions. A sensitive substrate ("wafer") 15 is mounted on a wafer stage 16 that also is movable in the X and Y directions. The multiple exposure units arranged in the Y direction within the chip pattern are sequentially exposed by synchronously scanning the reticle stage 11 and the wafer stage 16 in opposite Y directions from each other. Each stage 11, 16 is provided with a respective accurate position-measurement system utilizing a respective laser interferometer (not shown). Controlled movements of the stages 11, 16 ensure that demagnified images of the reticle exposure units are accurately "stitched" together on the wafer 15.

A "projection-optical system" is situated between the reticle 10 and the wafer 15. The projection-optical system comprises projection lenses 12, 14 (objective lenses) and a deflector 13. The illumination beam strikes a selected exposure unit of the reticle 10 to become a "patterned beam" propagating downstream of the reticle through the projection-optical system. The patterned beam is "reduced" (demagnified) by the projection lenses 12, 14 and deflected by the deflector 13 to form an image of the illuminated exposure unit at a specified location on the wafer 15. The upstream-facing surface of the wafer is coated with a suitable "resist" so as to be imprintable with the reticle images. As a dose of the patterned beam is imparted to the resist, the resist becomes imprinted with a demagnified image of the respective exposure unit.

The projection-optical system forms a crossover C.O.2 at an axial location that subdivides the axial distance between the reticle 10 and the wafer 15 according to the "demagnification ratio" of the projection-optical system. (The "demagnification ratio" is the ratio by which the exposure unit on the reticle is larger than the corresponding image formed on the wafer 15.) A contrast aperture 17 (also termed a "scattering aperture") is situated at the crossover C.O.2. The contrast aperture 17 blocks any non-patterned electrons that have been scattered by the reticle 10 so that such electrons do not reach the wafer 15.

The various lenses 3, 5, 9, 12, 14 and the various deflectors 8, 13 are connected to a controller 21. The controller 21 controllably energizes the individual lenses 3, 5, 9, 1 2, 14 and deflectors 8, 13 by respective power supplies 3a, 5a, 9a, 12a, 14a, and 8a, 13a. The reticle stage 11 and the wafer stage 16 also are connected to the controller 21 via respective stage-driver controllers 11a, 16a. The stage-driver controllers 11a, 16a controllably actuate movement of the respective stages 11, 16 according to data generated by the controller 21. As the various exposure units on the reticle 10 are sequentially illuminated, images of the exposure units are projected to respective locations on the wafer 15. The demagnified images of the exposure units are accurately stitched together on the wafer 15 in a way serving to "stitch" the images together and thus form a demagnified image of the chip-layer pattern on the wafer.

Next, a detailed example of a reticle used with the FIG. 3 apparatus to perform "divided" CPB projection exposure is described. In such divided projection exposure, the reticle pattern is divided into multiple exposure units (e.g., subfields) that are individually and sequentially exposed. Such exposure is performed while performing deflection control of the illumination-optical system (which has a large deflection stroke in X direction), and stage-movement control in the orthogonal Y direction. A large exposure field is produced on the wafer 15 in which images of the individual exposure units are contiguously stitched together to form the entire die on the wafer.

The principle by which the illumination beam is patterned by passage through the reticle is as follows: To define the pattern, the reticle has a corresponding array of first regions that highly scatter the charged particles in the illumination beam and a complementary array of second regions that impart little to no scattering to particles in the beam. As charged particles in the beam of encounter the first (i.e., highly scattering) regions, the particles recoil with generally large scattering angles, and as charged particles in the beam encounter the second (i.e., weakly scattering) regions, the particles exhibit little to no scattering angle. Generally, the projection-optical system includes an aperture (e.g., the contrast aperture 17) that transmits charged particles having a, at most, small scattering angle and blocks charged particles having a large scattering angle. The contrast aperture 17 is located at the pupil plane within the projection-optical system.

To impart the differential scattering summarized above, the reticle 10 comprises a membrane normally configured as a silicon thin film (0.1 $\mu$m to several $\mu$m thick). The reticle can be either of two general types. The first type is termed a "scattering" or "membrane" reticle on which a pattern of highly scattering material (e.g., heavy metal) is deposited. With a scattering reticle, the membrane imparts little to no scattering to particles in the illumination beam (compared to the heavy metal regions of the reticle). The second type is termed a "stencil" reticle in which the pattern is defined by a corresponding pattern of voids (through holes extending through the thickness dimension of the reticle) in a reticle membrane. With a stencil reticle, the membrane is imparts a relatively large scattering to the particles in the illumination beam (compared to the voids).

Figure 2:
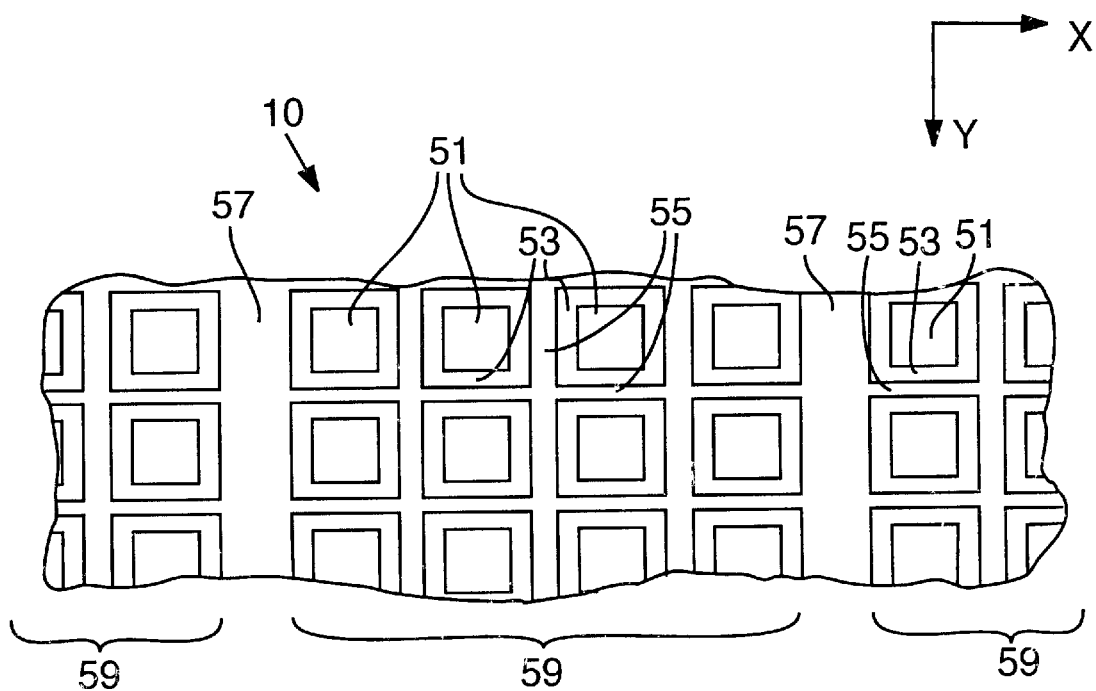
FIG. 2 is a plan view showing the structure of a scattering reticle used in any of various embodiments of the invention.

In FIG. 2, each of the areas indicated by the multiple squares 51 is an exposure unit (e.g., a reticle subfield) on the reticle. Each exposure unit 51 is typically square with sides measuring, by way of example, 0.5 to 5 mm in length. The boundary region 53 surrounding each exposure unit 51 is termed a "skirt." The skirt serves, inter alia, to clip portions of the illumination beam falling outside the boundary of the respective exposure unit 51. Hence, the skirt 53 is made from a particle-scattering material that imparts a large scattering angle to charged particles in the illumination beam. Each skirt 53 is, by way of example, 10 to 100 $\mu$m wide. The skirts 53 collectively define an orthogonal grid of struts (the grid is termed "grillage") in which the exposure units 51 are situated in regions between adjacent struts. Each strut is, by way of example, 0.5 to 1 mm thick and serves to maintain the mechanical strength and rigidity of the reticle. The grillage 55 is, by way of example, 100 $\mu$m wide.

In FIG. 2, the exposure units 51 are arrayed four to a row in the X direction. Each such row of four exposure units is termed a "group," and a group of such rows extending in the Y direction form a "stripe" 59. There are multiple stripes in the X direction. Between adjacent stripes 59 is a thick and wide strut 57; the struts 57 collectively minimize overall distortion of the reticle. By way of example, each stripe 59 is several millimeters wide; such a width corresponds to the maximum possible deflection of the illumination beam and patterned beam allowed by the illumination-optical system and projection-optical system.

During actual projection and exposure, the non-patterned areas of the reticle, namely the skirts and grillage, etc., are not exposed onto the wafer, thereby allowing the images of individual exposure units 51 to be stitched together over the entire chip. The usual demagnification ratio of the projection-optical system is 1:4 or 1:5. Under such conditions, if the size of a single chip as projected onto the wafer is 27 mm×44 mm for a 4-gigabit DRAM, then the overall size of the chip pattern on the reticle, (including the non-patterned areas) is about (120 to 230 mm)×(150 to 350 mm).

Figure 1:
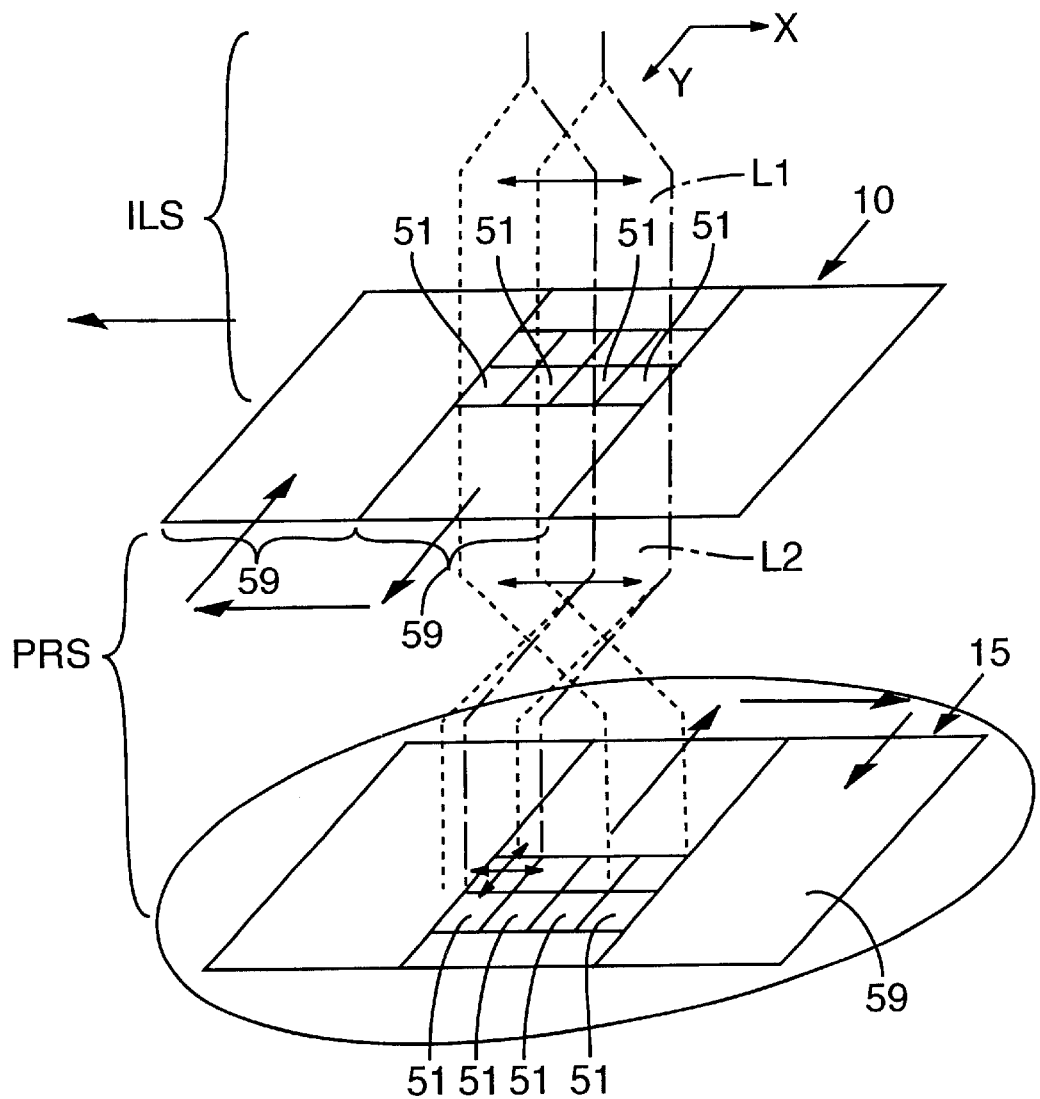
FIG. 1 is an oblique perspective view showing control of beam-deflection and movement of the reticle stage and wafer stage, according to a first representative embodiment of the invention.

An explanation of beam deflection and stage operation during projection-exposure of the reticle of FIG. 2 onto a wafer is now provided, referring to FIG. 1. FIG. 1 is an oblique perspective showing a representative procedure for projecting and transferring the reticle pattern onto a wafer 15. For simplicity, a reduction ratio of 1:1 is shown in FIG. 1. Although not detailed in FIG. 1, an illumination-optical system ILS (having a configuration as shown, e.g., in FIG. 3) is located in FIG. 1 upstream of the reticle 10, and a projection-optical system PRS is located between the reticle 10 and the wafer 15.

Deflection of the illumination beam L1 for illumination of the reticle 10 (i.e., "illumination deflection") is controlled in the right-left direction in the figure (i.e., the X direction). By primary deflection of the patterned beam L2 that has passed through the reticle 10, an image (less skirt and grillage) is formed on the wafer 15. The projection-optical system also performs an additional deflection function (called "corrective deflection") in which various corrections are made to stage-position errors, aberrations, etc. After exposure of one exposure unit 51, the adjacent exposure unit 51 in the X direction is exposed by illumination deflection. The length of one row of exposure units that can be exposed by illumination deflection (i.e., the width of a stripe 59) is determined by the width of the maximal deflection field achievable using the illumination-and projection-optical systems. Such optical systems currently being studied have deflection strokes of 20 to 60 mm.

Figure 11:
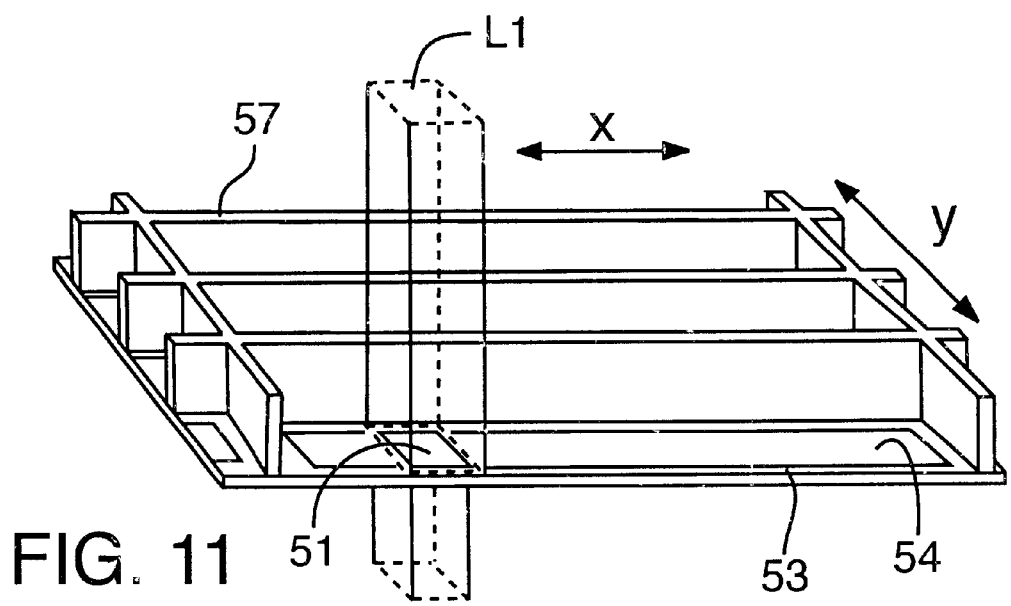
FIG. 11 is a perspective view showing an illumination beam being deflected in a continuous scanning fashion.

Upon completing all exposures in a row of exposure units within the deflection range, the reticle stage and wafer stage are stepped in mutually opposite Y directions, as indicated by the thick arrows in the figure, to allow the next row of exposure units to be sequentially exposed. To shorten the stepping time required for stage movement, it is also possible to perform exposure by continuously moving (scanning) the reticle stage and wafer stage. As the stages are being continuously moved, during the time that one row of exposure units is being exposed, the exposure units on the reticle are moved in the Y direction and the wafer is also moved in the Y direction as the exposure units are transferred to the wafer. The illumination beam and patterned beam are deflected simultaneously with the stage movements in the Y direction, causing the beams to be incident at the proper locations on the reticle and wafer, respectively. It is also possible to deflect the illumination beam in a continuous scanning fashion without providing non-patterned areas in a row 54 of exposure units 51, as shown in FIG. 11.

Upon completing exposure of a stripe 59 (encompassing the area that is exposed by controlled deflection of the beam in the X direction and movement of the stages Y direction), the reticle stage and wafer stage are moved stepwise in mutually opposite X directions, and exposure units within the next stripe are sequentially exposed.

Figures 4, 5:
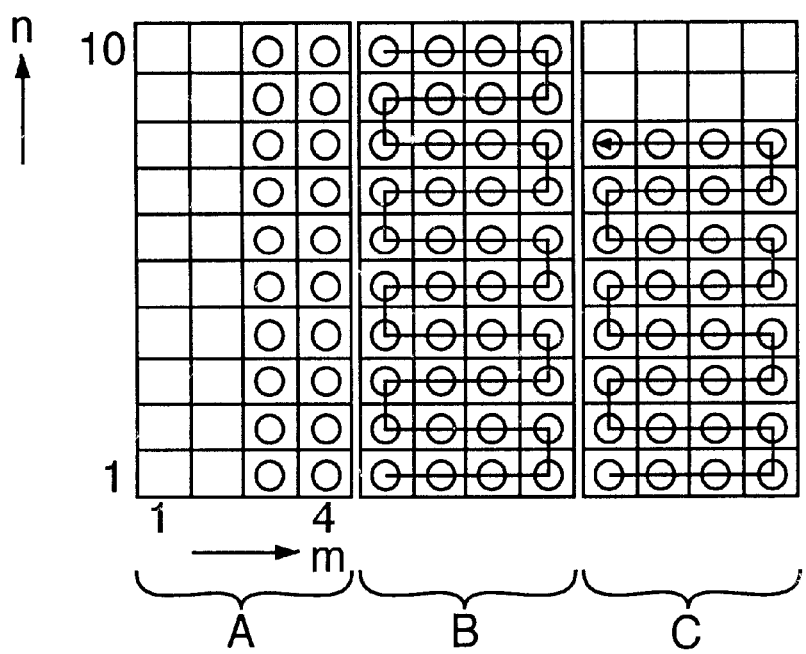
FIG. 4 is a table showing an arrangement of data for exposing individual exposure units of a reticle, according to a first example.
FIG. 5 is a plan view of the arrangement of stripes and subfields (including subfields to be exposed and other subfields not to be exposed) according to the first example.

A representative tabulation of exposure data governing projection and exposure is shown in FIG. 4. By way of example, the size of an exposure unit (subfield) is 0.25 mm square, the deflection range (stripe width) is 5 mm, and the stripe length is 30 mm. Further by way of example, each stripe has a total of 20×120=2,400 exposure units as exposed on the wafer. In FIG. 4, the exposure data for each exposure unit comprises (in addition to respective coordinates (x,y)) data for beam ON/OFF, exposure dose, and focal position. Of course, data for each of beam ON/OFF, exposure dose, and focus are not necessarily required for each exposure unit. Any two such data can be used. In addition, whereas data for only one stripe is shown in FIG. 4, similar exposure data are utilized for each of the other stripes.

An exposure of one type of pattern, as defined on the reticle, onto the wafer will be described as a first example embodiment of this invention. FIG. 5 is a plan view schematically showing, according to this example, a portion of the reticle that includes three representative stripes A, B, C. For simplicity, each stripe consists of 4×10 exposure units (subfields). Each subfield denoted by the symbol ○ is earmarked to receive the desired exposure dose.

A table of exposure data for the FIG. 5 reticle is shown in FIG. 6. In FIG. 6, only the beam ON/OFF data is listed for the respective subfields (m(1–10), n(1–4)) as exposure data. ON is denoted by "1" and OFF is denoted by "0." Exposure of the stripe A normally begins from the subfield in the lower left-hand corner (1,1) (see FIG. 5). However, since the beam is OFF for this subfield (1,1) and the next subfield (2,1) (see FIG. 6), these subfields are skipped, and exposure starts from the subfield (3,1) according to the exposure data in FIG. 6. Sequential exposure of subfields continues in the order: (4,1), (4,2), (3,2), (3,3), (4,3), as indicated in FIG. 5. In other words, exposure advances each time to the next ON subfield without the illumination beam striking intervening OFF subfields. Since all of the subfields are ON in the next stripe B, the subfields are exposed in order, from the top: (1,10), (2,10), (3,10), (4,10), (4,9), as indicated in FIG. 5. In stripe C, exposure begins at subfield (1,1); after subfields (4,8), (3,8), (2,8), (1,8) have been exposed, exposure of the pattern is completed. If the same pattern is to be exposed onto a different field on the wafer, the wafer stage is stepped to the new field and exposure of subfields commences in the reverse order from the previous field, i.e., from subfield (1,8) or (4,8) in stripe C.

As indicated in FIG. 5, the number of subfields in stripe A that are exposed within the deflection range of the illumination-optical system is relatively small. Therefore, for stripe A, the required deflection of the illumination beam in the direction of reticle-stage movement is smaller than required for stripes B and C. Reducing the amount of deflection of the beam as required for stripes such as stripe A advantageously increases throughput. I.e., the scanning velocity of both stages can be increased as the subfields are sequentially exposed while continuously moving the reticle stage and wafer stage.

Figures 7, 8:
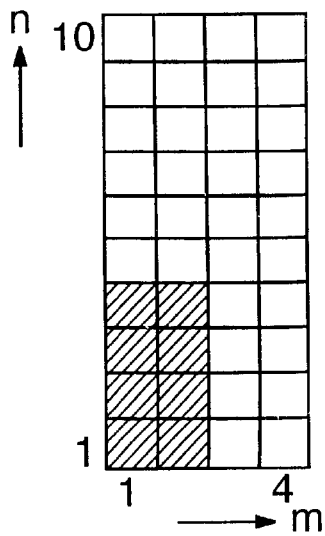
FIG. 7 is a plan view of exposure units (subfields) in a stripe according to the second example, the subfields including subfields to be exposed while changing the exposure dose and focal position and subfields in which these parameters are not changed.
FIG. 8 is a table of exposure data for exposing the subfields shown in FIG. 7.

According to a second example embodiment, the exposure dose at the wafer and the focal position during exposure are changed as required for desired exposure units on the reticle. FIG. 7 is a plan view schematically showing a reticle used in this example embodiment. For simplicity, the reticle in FIG. 7 comprises only one stripe containing 4×10=40 subfields. The hatched area in FIG. 7 denotes subfields requiring a smaller exposure dose and a slightly higher focal position than the other subfields of the stripe.

FIG. 8 shows a representative table of exposure doses and focal positions for the subfields in the stripe shown in FIG. 7. According to these exposure data, the exposure dose is 9.5 $\mu C/cm^2$ and the focal position is 0.3 $\mu$m in each of the hatched subfields, and the exposure dose is 10 $\mu C/cm^2$ and the focal position is 0 $\mu$m in each of the remaining subfields. The "focal position" in this example is the amount of axial displacement from a "standard" focus position. In this example, exposure was performed by simultaneously changing the exposure dose and the focal position for specific subfields. However, it is not necessary that exposure dose and focal position be changed simultaneously or that both be changed. Either can be changed without changing the other. Also, the subfields requiring a change of exposure dose and/or focal position need not all be in the same field. Such subfields can be in separate fields.

In this second example, data for exposure beam ON/OFF and exposure dose were handled separately according to the exposure data in FIG. 4. However, these data can be integrated as only the exposure dose, wherein the beam is OFF whenever the dose is 0 $\mu C/cm^2$, without exceeding the scope of the invention.

Therefore, according to the invention, each exposure unit has respective data for beam ON/OFF, exposure dose, and/or focal position to control exposure of the respective exposure units. As a result, the desired exposure units can be exposed without mechanically stopping movement of the stages. Also, any area on the reticle can be exposed without limiting the shape of each separately exposed area to a square or a rectangle. Since the exposure dose and/or focal position can be changed for certain desired exposure units within an exposure field, beam-width control is improved for exposing a pattern onto the wafer. Throughput is also improved because, during exposure of the pattern, exposure units in which the illumination beam is OFF are simply skipped.

Figure 9:
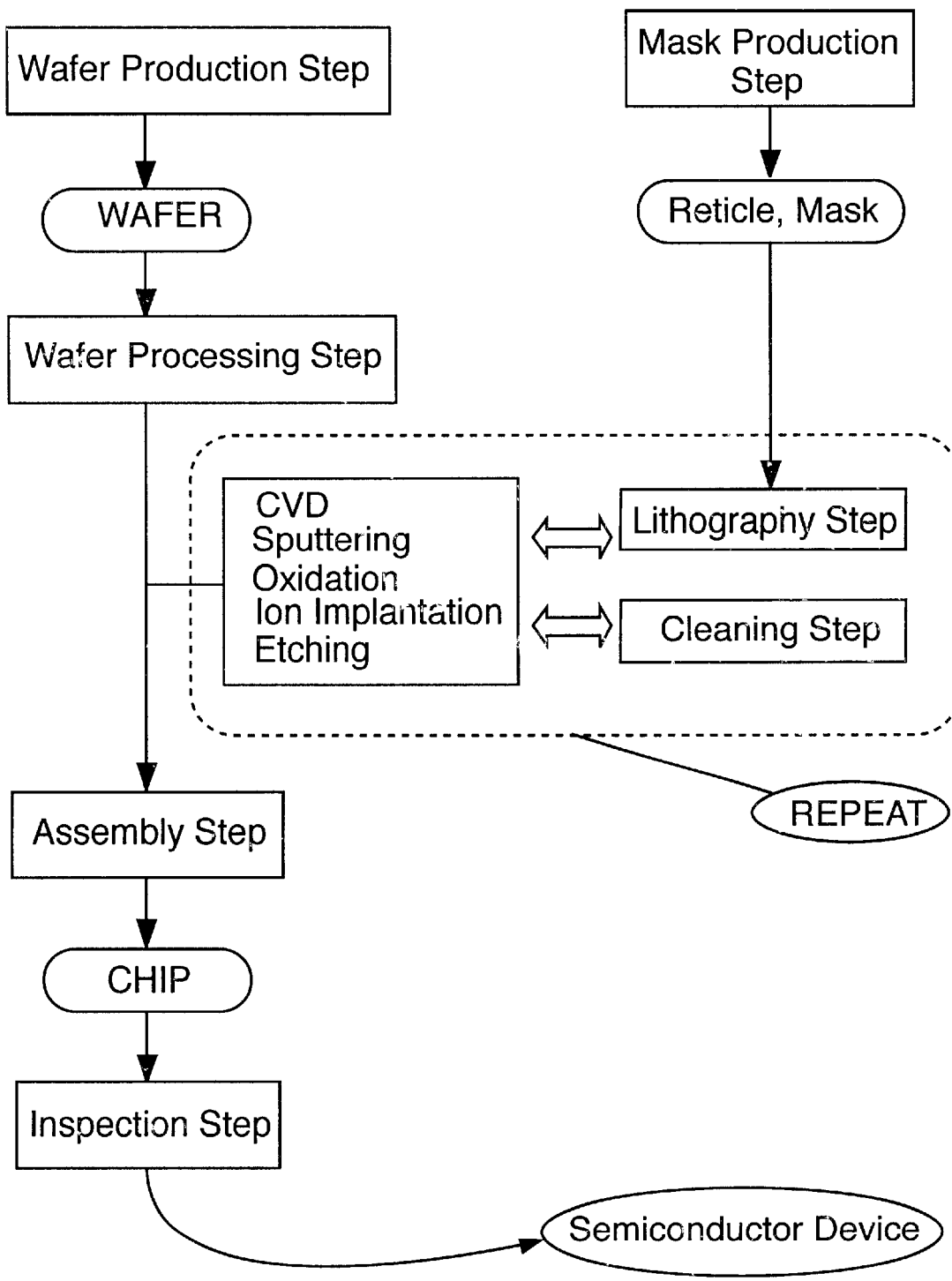
FIG. 9 is a process flowchart for manufacturing a semiconductor device, wherein the process includes a microlithography method according to the invention.

FIG. 9 is a flowchart of an exemplary semiconductor fabrication method to which apparatus and methods according to the invention can be readily applied. The fabrication method generally comprises the main steps of wafer production (wafer preparation), reticle production (reticle preparation), wafer processing, device assembly, and inspection. Each step usually comprises several sub-steps.

Among the main steps, wafer processing is key to achieving the smallest feature sizes (critical dimensions) and best inter-layer registration. In the wafer-processing step, multiple circuit patterns are successively layered atop one another on the wafer, wherein the formation of each layer typically involves multiple sub-steps. Usually, many operative semiconductor devices are produced on each wafer.

Typical wafer-processing steps include: (1) thin-film formation involving formation of a dielectric layer for electrical insulation or a metal layer for connecting wires; (2) microlithography to form a resist pattern for selective processing of the thin film or the substrate itself; (3) etching or analogous step to etch the thin film or substrate according to the resist pattern, or doping as required to implant ions or impurities into the thin film or substrate according to the resist pattern; (4) resist stripping to remove the resist from the wafer; and (5) chip inspection. Wafer processing is repeated as required (typically many times) to fabricate the desired semiconductor chips on the wafer.

Figure 10:
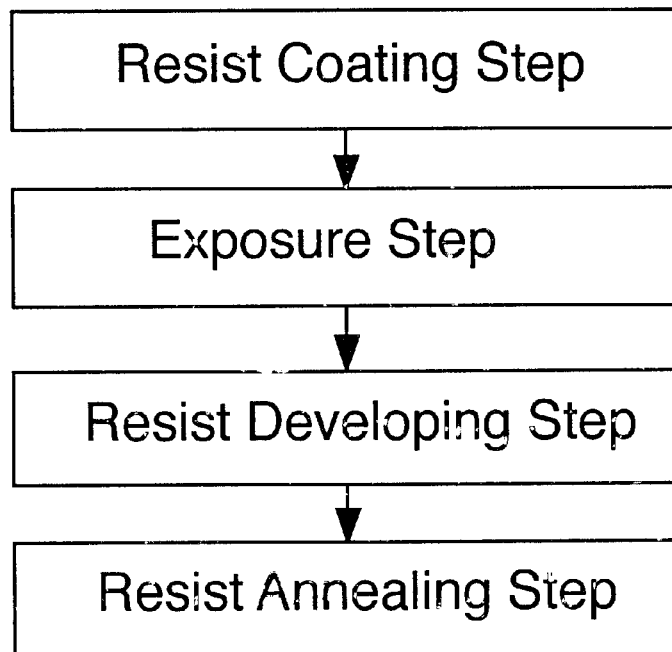
FIG. 10 is a process flowchart for performing a microlithography method that includes a projection-exposure method according to the invention.

FIG. 10 provides a flow chart of typical steps performed in microlithography, which is a principal step in wafer processing. The microlithography step typically includes: (1) resist-coating step, wherein a suitable resist is coated on the wafer substrate (which can include a circuit element formed in a previous wafer-processing step; (2) exposure step, to expose the resist with the desired pattern; (3) development step, to develop the exposed resist; and (4) annealing step, to enhance the durability of the resist pattern.

Methods and apparatus according to the invention can be applied to a semiconductor fabrication process, as summarized above, to provide substantially improved throughput without sacrificing accuracy or resolution.

Whereas the invention has been described in connection with multiple embodiments and examples, it will be understood that the invention is not limited to those embodiments and examples. On the contrary, the invention is intended to encompass all alternatives, modifications, and equivalents as may be included within the spirit and scope of the invention as defined by the appended claims.

What is claimed is:

1. A method for performing projection microlithography using a charged particle beam, comprising:
   (a) defining, on a reticle, a pattern to be transferred to a sensitive substrate, the pattern being divided on the reticle into separate exposure units each defining a respective portion of the pattern;
   (b) sequentially illuminating the individual exposure units using a charged-particle illumination beam, wherein, as particles in the illumination beam pass through each exposure unit, a patterned beam is formed propagating downstream of the reticle;
   (c) for each illuminated exposure unit, projecting the patterned beam onto a respective region of the sensitive substrate so as to form an image of the illuminated exposure unit on the respective region, the respective regions being located so as to cause the images of the illuminated exposure units to be stitched together;
   (d) providing ON/OFF control data for the illumination beam for each of the exposure units on the reticle; and
   (e) exposing each exposure unit based on the ON/OFF data.

2. The method of claim 1, wherein:
   step (a) comprises arranging the exposure units in a two-dimensional array in X and Y directions on the reticle;
   step (b) comprises sequentially illuminating the exposure units of the reticle in the X direction by a controlled deflection of the illumination beam;
   step (c) comprises, in coordination with step (b), controllably deflecting the patterned beam in the X direction, the deflections in the X direction being coordinated with movements of the reticle and substrate in the Y direction as required to sequentially project each exposure unit onto a desired location on the sensitive substrate.

3. The method of claim 2, wherein, whenever an exposure unit is encountered in which the illumination beam is OFF, exposure is advanced to a subsequent exposure unit without illuminating the previous exposure unit.

4. The method of claim 1, wherein, whenever an exposure unit is encountered in which the illumination beam is OFF, exposure is advanced to a subsequent exposure unit without illuminating the previous exposure unit.

5. The method of claim 1, wherein:
   step (a) comprises two-dimensionally arranging the exposure units in X and Y directions on the reticle;
   step (b) comprises sequentially illuminating the exposure units of the reticle in the X direction by a controlled deflection of the illumination beam;
   step (c) comprises, in coordination with step (b), controllably deflecting the patterned beam in the X direction in a sequential manner, the deflections in the X direction being coordinated with continuous movements of the reticle and substrate in the Y direction as required to sequentially project each exposure unit onto a desired location on the sensitive substrate;
   in step (b), whenever an exposure unit is encountered in which the illumination beam should be OFF, exposure is advanced to a subsequent exposure unit without illuminating the previous exposure unit; and
   at Y coordinates including one or more exposure units in which the illumination beam should be OFF, moving the reticle and substrate at respective velocities that are increased relative to respective base velocities at Y coordinates having no exposure units in which the illumination beam should be OFF, the increased velocities at a respective Y coordinate being greater than base velocities according to a number of exposure units arrayed in the X direction at the respective Y coordinate in which the illumination beam should be OFF.

6. A semiconductor-fabrication process, comprising the steps of:
   (a) preparing a wafer;
   (b) processing the wafer; and
   (c) assembling devices formed on the wafer during steps (a) and (b), wherein step (b) comprises a method for performing projection microlithography as recited in claim 1.

7. A semiconductor device produced by the method of claim 6.

8. A charged-particle-beam projection-exposure method, comprising:
   (a) defining, on a reticle, a pattern to be transferred to a sensitive substrate, the pattern being divided on the reticle into multiple exposure units;
   (b) illuminating individual exposure units on the reticle with an illumination charged particle beam to form, for each illuminated exposure unit, a respective patterned beam propagating downstream of the reticle;
   (c) projecting the patterned beam to form an image of each exposed exposure unit on the sensitive substrate, the respective images being situated at respective locations on the substrate such that the images are stitched together on the sensitive substrate to form the pattern on the substrate; and
   (d) for each exposure unit, providing data for at least one of a respective exposure dose and a respective focal position, wherein steps (b) and (c) are performed according to the data such that, for exposure of an exposure unit, one or both of exposure dose and focal position are changed, according to the data, relative to another exposure unit of the pattern.

9. The method of claim 8, wherein one or both of exposure dose and focal position are changed so as to correct a respective effect of a characteristic of the sensitive substrate at the respective location.

10. The method of claim 9, wherein the characteristic is selected from the group consisting of variations in step height, variations in resist thickness, and variations in beam reflectivity of a material at the respective location on the sensitive substrate.

11. A semiconductor-fabrication process, comprising the steps of:
   (a) preparing a wafer;
   (b) processing the wafer; and
   (c) assembling devices formed on the wafer during steps (a) and (b), wherein step (b) comprises a method for performing projection microlithography as recited in claim 8.

12. A semiconductor device produced by the method of claim 11.

13. A charged-particle-beam projection-exposure apparatus, comprising:
   (a) a movable substrate stage on which a sensitive substrate is mountable;
   (b) a movable reticle stage on which a reticle is mountable, the reticle defining a pattern to be projection-transferred to the substrate, the pattern being divided on the reticle into multiple exposure units two-dimensionally arrayed in X and Y directions;
   (c) an illumination-optical system configured and situated so as to sequentially illuminate individual exposure units on the reticle with a charged-particle illumination beam, wherein particles of the illumination beam passing through an illuminated exposure unit form a patterned beam propagating downstream of the reticle;
   (d) a projection-optical system configured and situated so as to project the patterned beam to form an image of the illuminated exposure unit at a desired location on the sensitive substrate, the images of the respective exposure units being situated on the substrate so as to be stitched together and form the pattern on the substrate; and
   (e) a controller connected to so as to controllably operate the reticle stage, the substrate stage, the illumination-optical system, and the projection-optical system such that the controller (1) causes the illumination-optical system and the projection-optical system to deflect the illumination beam and patterned beam, respectively, in the X direction so as to sequentially illuminate and project exposure units on the reticle; (2) causes the reticle stage and substrate stage to move coordinatedly in the Y direction to sequentially illuminate and project exposure units on the reticle; and (3) provides exposure data concerning ON/OFF control of illumination for each exposure unit.

14. The apparatus of claim 13, wherein the controller is further operable to cause the illumination beam and the patterned beam to have a small-stroke deflection in the Y direction; sequentially expose the exposure units while continuously moving the reticle stage and substrate stage at least a base velocity during exposure; and increase the base velocity by a factor proportional to a number of exposure units, arrayed in the X direction at a respective Y coordinate value, that have OFF exposure data.

15. A semiconductor-fabrication process, comprising the steps of:
   (a) preparing a wafer;
   (b) processing the wafer; and
   (c) assembling devices formed on the wafer during steps (a) and (b), wherein step (b) comprises the steps of (i) applying a resist to the wafer; (ii) exposing the resist; developing the resist; and (iv) annealing the resist; and step (ii) comprises providing a charged-particle-beam projection-exposure apparatus as recited in claim 13; and using the charged-particle-beam projection-exposure apparatus to expose the resist with the pattern defined on the reticle.

16. A semiconductor device produced by the method of claim 15.

17. A charged-particle-beam projection-exposure apparatus, comprising:
   (a) a movable substrate stage on which a sensitive substrate is mountable;
   (b) a movable reticle stage on which a reticle is mountable, the reticle defining a pattern to be projection-transferred to the substrate, the pattern being divided on the reticle into multiple exposure units arrayed in X and Y directions;
   (c) an illumination-optical system configured and situated so as to illuminate individual exposure units on the reticle with a charged-particle illumination beam, wherein particles of the illumination beam passing through an illuminated exposure unit form a patterned beam propagating downstream of the reticle;
   (d) a projection-optical system configured and situated so as to project the patterned beam to form an image of the illuminated exposure unit at a desired location on the sensitive substrate, the images of the respective exposure units being situated on the substrate so as to be stitched together and form the pattern on the substrate; and
   (e) a controller connected so as to controllably operate the reticle stage, the substrate stage, the illumination-optical system, and the projection-optical system such that the controller (1) causes the illumination-optical system and the projection-optical system to deflect the illumination beam and patterned beam, respectively, in the X direction so as to illuminate and project exposure units from the reticle to the substrate; (2) causes the reticle stage and substrate stage to move coordinately in the Y direction as the exposure units are projected from the reticle to the substrate; and (3) for each exposure unit to be exposed, provides data concerning at least one of a respective exposure dose and a respective focal position such that, for exposure of an exposure unit, one or both of the respective exposure dose and respective focal position are changed, according to the data, relative to another exposure unit of the pattern.

18. A semiconductor-fabrication process, comprising the steps of:

(a) preparing a wafer;

(b) processing the wafer; and (c) assembling devices formed on the wafer during steps (a) and (b), wherein step (b) comprises the steps of (i) applying a resist to the wafer; (ii) exposing the resist; developing the resist; and (iv) annealing the resist; and step (ii) comprises providing a charged-particle-beam projection-exposure apparatus as recited in claim 17; and using the charged-particle-beam projection-exposure apparatus to expose the resist with the pattern defined on the reticle.

19. A semiconductor device produced by the method of claim 18.

* * * * *

UNITED STATES PATENT AND TRADEMARK OFFICE
CERTIFICATE OF CORRECTION

PATENT NO.   : 6,433,347 B1
DATED        : August 13, 2002
INVENTOR(S)  : Suzuki It is certified that error appears in the above-identified patent and that said Letters Patent is hereby corrected as shown below:

Column 1,
Line 37, "reticle" should be -- reticle (i.e. --.

Column 7,
Line 53, "beam of" should be -- beam --.

Column 8,
Line 9, "membrane is" should be -- membrane --.

Column 14,
Line 28, "developing the resist;" should be -- (iii) developing the resist; --.

Column 16,
Line 4, "developing the resist;" should be -- (iii) developing the resist; --.

Signed and Sealed this

Eighth Day of July, 2003

JAMES E. ROGAN
*Director of the United States Patent and Trademark Office*